United States Patent
Furuhashi et al.

(10) Patent No.: US 9,515,145 B2
(45) Date of Patent: Dec. 6, 2016

(54) VERTICAL MOSFET DEVICE WITH STEADY ON-RESISTANCE

(71) Applicant: Mitsubishi Electric Corporation, Chiyoda-ku (JP)

(72) Inventors: Masayuki Furuhashi, Tokyo (JP); Hiroaki Okabe, Tokyo (JP); Tomokatsu Watanabe, Tokyo (JP); Masayuki Imaizumi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/768,542

(22) PCT Filed: Feb. 14, 2014

(86) PCT No.: PCT/JP2014/000746
§ 371 (c)(1),
(2) Date: Aug. 18, 2015

(87) PCT Pub. No.: WO2014/132582
PCT Pub. Date: Sep. 4, 2014

(65) Prior Publication Data
US 2015/0380494 A1    Dec. 31, 2015

(30) Foreign Application Priority Data

Feb. 28, 2013 (JP) .................................. 2013-039402

(51) Int. Cl.
*H01L 29/24* (2006.01)
*H01L 21/336* (2006.01)
(Continued)

(52) U.S. Cl.
CPC ......... *H01L 29/1608* (2013.01); *H01L 21/049* (2013.01); *H01L 29/1033* (2013.01);
(Continued)

(58) Field of Classification Search
CPC .................... H01L 29/7802; H01L 29/7813
See application file for complete search history.

(56) References Cited

U.S. PATENT DOCUMENTS 5,736,753 A * 4/1998 Ohno .................. H01L 29/1608
257/147
7,009,269 B2    3/2006 Yasuda
(Continued)

FOREIGN PATENT DOCUMENTS

| JP | 2005 150321 | 6/2005 |
| JP | 2007 180116 | 7/2007 |

OTHER PUBLICATIONS

International Preliminary Report on Patentability and Written Opinion issued Sep. 1, 2015 in PCT/JP2014/000746 (with English translation, filed Feb. 14, 2014).
(Continued)

*Primary Examiner* — Victor A Mandala
*Assistant Examiner* — Regan J Rundio
(74) *Attorney, Agent, or Firm* — Oblon, McClelland, Maier & Neustadt, L.L.P.

(57) ABSTRACT

A semiconductor device capable of reducing ON-resistance changes with temperature, including a semiconductor substrate of a first conductivity type, a drift layer of the first conductivity type formed on the semiconductor substrate, a first well region of a second conductivity type formed in the front surface of the drift layer, a second well region of the second conductivity type formed in the front surface of the drift layer, and a gate structure that is formed on the front surface of the drift layer and forms a channel in the first well region and a channel in the second well region. A channel resistance of the channel formed in the first well region has a temperature characteristic that the channel resistance decreases with increasing temperature and a channel resistance of the channel formed in the second well region has a
(Continued)

temperature characteristic that the channel resistance increases with increasing temperature.

24 Claims, 4 Drawing Sheets

(51) Int. Cl.
  *H01L 29/78* (2006.01)
  *H01L 21/425* (2006.01)
  *H01L 29/16* (2006.01)
  *H01L 21/04* (2006.01)
  *H01L 29/34* (2006.01)
  *H01L 29/66* (2006.01)
  *H01L 29/10* (2006.01)
  *H01L 29/06* (2006.01)
  *H01L 29/739* (2006.01)

(52) U.S. Cl.
  CPC .......... *H01L 29/1095* (2013.01); *H01L 29/34* (2013.01); *H01L 29/66068* (2013.01); *H01L 29/78* (2013.01); *H01L 29/7802* (2013.01); *H01L 29/7813* (2013.01); *H01L 29/0696* (2013.01); *H01L 29/7395* (2013.01); *H01L 29/7397* (2013.01)

(56) References Cited

U.S. PATENT DOCUMENTS

| | | | |
|---|---|---|---|
| 7,633,123 B2 | 12/2009 | Yamauchi et al. | |
| 7,671,409 B2* | 3/2010 | Kitabatake | H01L 29/7828 257/341 |
| 8,133,787 B2* | 3/2012 | Endo | H01L 21/049 257/E29.257 |
| 2012/0018743 A1* | 1/2012 | Hiyoshi | H01L 21/049 257/77 |
| 2012/0313112 A1* | 12/2012 | Wada | H01L 29/045 257/77 |

OTHER PUBLICATIONS

International Search Report Issued Apr. 8, 2014 in PCT/JP2014/000746 filed Feb. 14, 2014.

Niwayama, M. et al. "SiC Power Device and Loss-Reduction Operation", Panasonic Technical Journal, vol. 57, No. 1, pp. 9-14, 2011.

* cited by examiner

VERTICAL MOSFET DEVICE WITH STEADY ON-RESISTANCE

TECHNICAL FIELD

The present invention relates to a semiconductor device, and more particularly, to an insulated gate semiconductor device.

BACKGROUND ART

Switching elements such as insulated gate bipolar transistors (IGBTs) or metal oxide semiconductor field effect transistors (MOSFETs) made of silicon (Si) have been customarily included in power electronics equipment. In recent years, switching elements made of silicon carbide (SiC) having physical properties superior to those of Si have been actively developed.

The withstand voltage of MOSFETs depends on the thickness of the drift layer. SiC has a breakdown electric field higher than that of Si, and thus, the drift layer of a MOSFET made of SiC having a withstand voltage equal to that of a MOSFET made of Si can be thinner than the drift layer of the MOSFET made of Si. The ON resistance of the MOSFET is composed of, for example, channel resistance, JFET resistance, drift resistance, and substrate resistance. The SiC-MOSFET including a thinner drift layer as described above has a reduced drift resistance and thus achieves lower loss.

Unfortunately, currently used SiC-MOSFETs have an ON resistance that is still higher than the theoretical limit value of SiC. This is attributed to a higher channel resistance. Conventional SiC-MOSFETs are known to reduce the channel resistance by eliminating or reducing variations in channel length and thus achieving a miniscule channel length (see, for example, Non-Patent Document 1).

PRIOR ART DOCUMENT

Non-Patent Document 1: Panasonic Technical Journal. Vol. 57, No. 1, pp. 9-14 (2011).

SUMMARY OF INVENTION

Problems to be Solved by the Invention

Typical semiconductor devices being unipolar transistor elements have a temperature characteristic (hereinafter referred to as "positive temperature characteristic") that the value of ON resistance increases with increasing temperature. Thus, in the semiconductor device according to Non-Patent Document 1, the ON resistance rises about 30% when the temperature of the semiconductor element increases from room temperature to about 150° C. The semiconductor device having the positive temperature characteristic produces a positive feedback; the semiconductor device used under the constant voltage condition generates heat due to an electric power loss of the element and the heat generation causes an increase in ON resistance, resulting in a further increase in the amount of heat generation. Unfortunately, this causes a further increase in the temperature of the semiconductor element, resulting in greater electric power loss. In some cases, the element can be destroyed due to the temperature increase undergoing the positive feedback.

Meanwhile, the impurity concentration or the interface state density at the interface between the well region and the gate oxide film of a MOSFET is increased, thereby providing a temperature characteristic (hereinafter referred to as "negative temperature characteristic") that the value of channel resistance of the MOSFET decreases with increasing temperature. If the amount of decrease in channel resistance is offset by the amount of increase in, for example, drift resistance having the positive temperature characteristic, the ON resistance of the semiconductor device can be kept constant. Unfortunately, if the channel resistance has the negative temperature characteristic resulting from an increased impurity concentration in the well region or an increased interface state density in order to keep the ON resistance constant, the ON resistance significantly increases in the low-temperature region at about room temperature.

The present invention therefore has been made to solve the problems described above, and an object thereof is provide a semiconductor device capable of reducing ON-resistance changes with temperature.

Means to Solve the Problems

A semiconductor device according to the present invention includes a semiconductor substrate of a first conductivity type, a drift layer of the first conductivity type formed on the semiconductor substrate, a first well region of a second conductivity type formed in a front surface of the drift layer, a second well region of the second conductivity type formed in the front surface of the drift layer, and a gate structure that is formed on the front surface of the drift layer and forms a channel in the first well region and a channel in the second well region. A channel resistance value of the channel formed in the first well region has a temperature characteristic that the channel resistance value decreases with increasing temperature and a channel resistance value of the channel formed in the second well region has a temperature characteristic that the channel resistance value increases with increasing temperature.

Effects of the Invention

In the semiconductor device according to the present invention, the channel resistance of the channel formed in the first well region has the temperature characteristic that the channel resistance decreases with increasing temperature and the channel resistance of the channel formed in the second well region has the temperature characteristic that the channel resistance increases with increasing temperature. Thus, the channels in different temperature characteristics are formed in each individual semiconductor device. This can reduce changes, with temperature, in the ON resistance of the semiconductor device as a whole.

DESCRIPTION OF EMBODIMENTS

Embodiment 1

Figure 1:
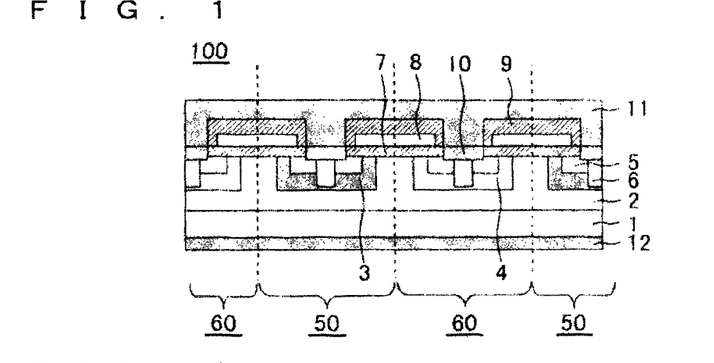
FIG. 1 A cross-sectional view of a part of a semiconductor device according to an embodiment 1 of the present invention.

Firstly, a configuration of a semiconductor device according to an embodiment 1 of the present invention is described. FIG. 1 is a cross-sectional view of a part of the semiconductor device according to the embodiment 1 of the present invention. An n-type MOSFET is described as an example of the semiconductor device according to the present embodiment. Alternatively, the semiconductor device may be a p-type MOSFET or another insulated gate semiconductor device.

An effective acceptor density hereinafter refers to a density obtained by deducting the density of n-type impurities from the density of p-type impurities in a predetermined area. An effective acceptor concentration hereinafter refers to a concentration obtained by deducting the concentration of n-type impurities from the concentration of p-type impurities in a predetermined area. The effective acceptor density and the effective acceptor concentration are used to explain the n-type semiconductor device in the present embodiment. Alternatively, for a p-type semiconductor device, an effective donor density replaces the effective acceptor density and an effective donor concentration replaces the effective acceptor concentration.

With reference to FIG. 1, a semiconductor device 100 is a MOSFET including a first unit cell 50 and a second unit cell 60. More specifically, a plurality of the first unit cells 50 and a plurality of the second unit cells 60 shown in FIG. 1 are connected in parallel and included in each individual semiconductor device 100.

The first unit cell 50 includes a semiconductor substrate 1 of n type, a drift layer 2 of n type formed on the front surface of the semiconductor substrate 1, a first well region 3 of p type formed on the front surface side of the drift layer 2, a source region 5 of n type formed on the front surface side of the drift layer 2, and a well contact region 6 formed on the front surface side of the drift layer 2. The first unit cell 50 further includes: a gate structure on the front surfaces of the drift layer 2, the first well region 3, and the source region 5; a silicide layer 10 formed on the source region 5 and the well contact region 6; a source electrode 11 (first electrode) formed on the silicide layer 10; and a drain electrode 12 (second electrode) formed on the back surface of the semiconductor substrate 1. The gate structure includes: a gate oxide film 7 formed on the front surfaces of the drift layer 2, the first well region 3, and the source region 5; a gate electrode 8 formed on the gate oxide film 7; and an interlayer film 9 formed to cover the gate electrode 8. The first unit cell 50 is formed such that the resistance value of the channel formed in the first well region 3 in the application of voltage to the gate electrode 8 has the negative temperature characteristic.

The second unit cell 60 includes the semiconductor substrate 1 of n type, the drift layer 2 of n type formed on the semiconductor substrate 1, a second well region 4 of p type formed on the front surface side of the drift layer 2, the source region 5 of n type formed on the front surface side of the drift layer 2, and the well contact region 6 formed on the front surface side of the drift layer 2. The second unit cell 60 further includes: the gate structure on the front surfaces of the drift layer 2, the second well region 4, and the source region 5; the silicide layer 10 formed on the source region 5 and the well contact region 6; the source electrode 11 formed on the silicide layer 10; and the drain electrode 12 formed on the lower part of the semiconductor substrate 1. The gate structure includes: the gate oxide film 7 formed on the front surfaces of the drift layer 2, the second well region 4, and the source region 5; the gate electrode 8 formed on the gate oxide film 7; and the interlayer film 9 formed to cover the gate electrode 8. The second unit cell 60 is formed such that the resistance value of the channel formed in the second well region 4 in the application of voltage to the gate electrode 8 has the positive temperature characteristic.

In the first unit cell 50 and the second unit cell 60, channels are formed in the upper part of the first well region 3 and the upper part of the second well region 4 in response to the application of voltage to the gate electrode 8, thereby electrically connecting the source electrode 11 and the drain electrode 12.

Figure 2:
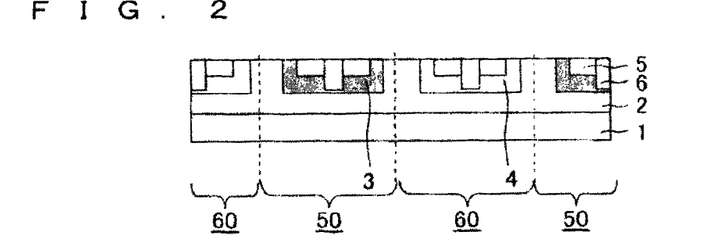
FIG. 2 A cross-sectional view of a process of a method for manufacturing the semiconductor device according to the embodiment 1 of the present invention.
Figure 3:
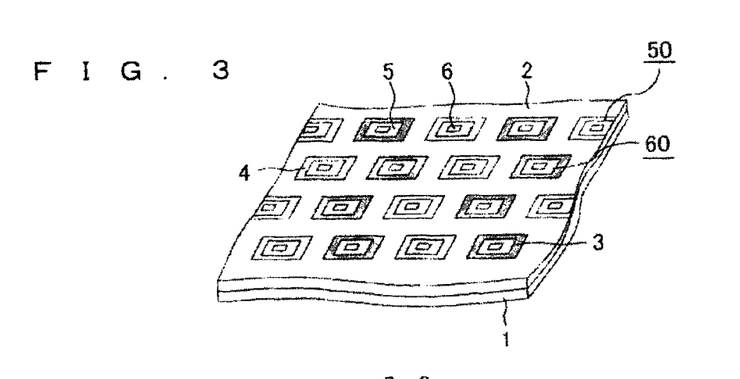
FIG. 3 A bird's-eye view of a configuration of the semiconductor device according to the embodiment 1 of the present invention.
Figure 4:
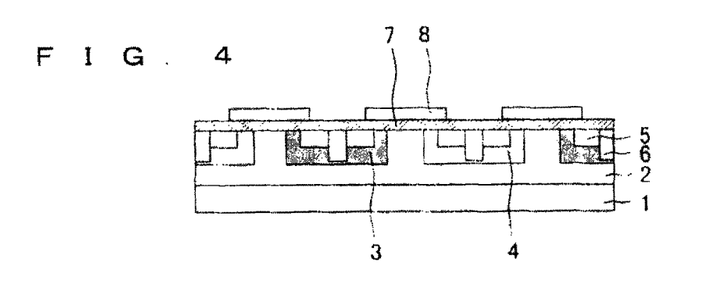
FIG. 4 A cross-sectional view of a process of the method for manufacturing the semiconductor device according to the embodiment 1 of the present invention.
Figure 5:
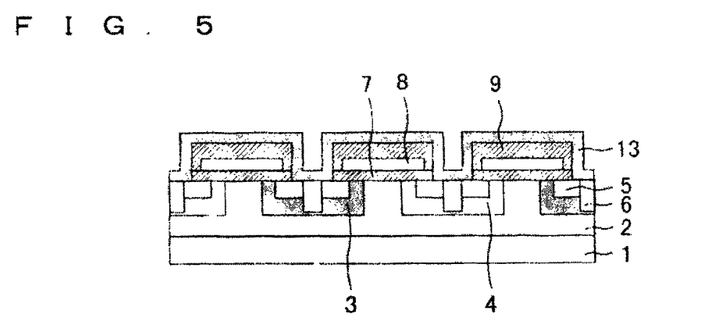
FIG. 5 A cross-sectional view of a process of the method for manufacturing the semiconductor device according to the embodiment 1 of the present invention.

Next, a method for manufacturing the semiconductor device according to the embodiment 1 is described. FIGS. 2, 4, and 5 are views of each process of the method for manufacturing the semiconductor device according to the embodiment 1. FIG. 3 is a bird's-eye view of a part of the process for manufacturing the semiconductor device according to the embodiment 1.

With reference to FIG. 2, the n-type semiconductor substrate 1 made of silicon carbide and having the n-type drift layer 2 formed on the front surface thereof is prepared. The semiconductor substrate 1 may be inclined at an angle smaller than or equal to 8° in the c-axis direction or may have no inclination. The semiconductor substrate 1 may have any plane direction. The drift layer 2 is doped with an n-type impurity. The drift layer 2 has an impurity concentration within the range of, for example, $1 \times 10^{13}$ to $1 \times 10^{17}$ cm$^{-3}$. The drift layer 2 has an thickness of, for example, 5 to 200 µm.

Then, a p-type impurity or an n-type impurity is implanted by, for example, ion implantation through the use of a resist mask or an oxide film mask processed by photolithography, to thereby form the first well region 3 of p type, the second well region 4 of p type, and the source region 5 of n type. As to the first well region 3 and the second well region 4, it is only required that the first well region 3 or the second well region 4 is selectively formed in the upper part of the drift layer 2. With reference to FIG. 2, the first well region 3 is formed in the region in which the first unit cell 50 is to be formed and the second well region 4 is formed in the region in which the second unit cell 60 is to be formed. The p-type impurity is preferably, for example, aluminum or boron. The p-type impurity having a concentration within the range of, for example, $1 \times 10^{16}$ to $1 \times 10^{19}$ cm$^{-3}$ is desirably implanted such that the p-type impurity concentration exceeds the n-type impurity concentration of the drift layer 2 and thus the well regions 3 and 4 each have p type. The well regions 3 and 4 each have a depth within the range of, for example, 0.3 to 4.0 µm so as not to extend off the drift layer 2.

The temperature characteristics of the channel resistance can be adjusted via the p-type impurity concentrations in the front surfaces of the well regions 3 and 4. In the formation of the well regions 3 and 4, ions are implanted to reflect the dope amount and the acceleration energy that allow the front surface of each well region to have the desired impurity concentration. The setting of impurity concentrations in particular will be described later. The front surfaces of the well regions 3 and 4 may include n-type impurities.

For example, as shown in FIG. 3, the first unit cells 50 and the second unit cells 60 can be arranged alternately to be adjacent to each other on the semiconductor substrate 1. With reference to FIG. 3, equal numbers of the first unit cells 50 and the second unit cells 60 are formed. Alternatively, the first unit cells 50 and the second unit cells 60 may be arranged in accordance with a constituent ratio that has been changed based on the temperature characteristic of each unit cell. Thus, for the first unit cells 50 and the second unit cells 60 in a constituent ratio of 1:2, the second unit cells 60 in two rows and the first unit cells 50 in a row may be arranged one after the other, forming the alternate arrangement of the first unit cells 50 and the second unit cells 60. That is, in the process of forming the first well region 3 and the second well region 4, the first well regions 3 and the second well regions 4 are alternately formed in accordance with the constituent ratio. The setting of the constituent ratio of the unit cells will be described later.

Next, to achieve an excellent metallic contact to each of the well regions 3 and 4, the p-type well contact region 6 having an impurity concentration higher than that of each of the well regions 3 and 4 is formed by ion implantation. Although not shown in the drawings, a p-type termination region for providing the semiconductor device 100 with a higher withstand voltage is desirably formed in the termination portion of the element active region by ion implantation.

Then, although not shown in the drawings, for example, a heat treatment is performed in an inert gas such as argon and nitrogen or in a vacuum at temperatures between, for example, 1500 and 2200° C. inclusive for a duration of 0.5 to 60 minutes. Consequently, the implanted impurities are electrically activated. Subsequently, an oxide film is formed by sacrificial oxidization and then the oxide film is removed by hydrofluoric acid, so that a surface alteration layer on the front surface of the drift layer 2 is removed to expose a clean surface. Then, a silicon oxide film is formed and the formed silicon oxide film is patterned to form a field oxide film covering the area except for the element active region, which is made open.

With reference to FIG. 4, the gate oxide film 7 being an insulating film is formed to cover the front surfaces of the well regions 3 and 4 sandwiched between the source region 5 and the drift layer 2. The gate oxide film 7 is formed by, for example, thermal oxidization or deposition. After the gate oxide film 7 is formed, a nitriding treatment is performed. In the present embodiment, inactivation through the nitriding treatment is continued until the interface state density at the interface between the gate oxide film 7 and the well regions 3 and 4 has, in the band gap, a mean value of $1 \times 10^{12}$ eV$^{-1}$ cm$^{-2}$ or less.

The nitriding treatment provides a heat treatment in an atmosphere of, for example: one kind of gas selected from a nitrogen monoxide (NO) gas, a dinitrogen oxide (N$_2$O) gas, a nitrogen dioxide (NO$_2$) gas, and an ammonia (NH$_3$) gas; a mixed gas containing two or more gases selected from the above; or a mixed gas containing an inert gas and any gas selected from the above. The heat treatment is desirably performed at temperatures between 1150° C. and 1350° C. inclusive.

Subsequently, as shown in FIG. 4, a silicon layer (not shown) is formed on the gate oxide film 7 and then the silicon layer is patterned to form the gate electrode 8. In the present embodiment, the silicon layer is polycrystalline or amorphous and is deposited on the gate oxide film 7 by, for example, chemical vapor deposition (CVD). The silicon layer desirably includes impurities to have the same conductivity type.

Next, with reference to FIG. 5, the interlayer film 9 is deposited over the gate oxide film 7 and the gate electrode 8 by, for example, CVD. After that, the interlayer film 9 and the gate oxide film 7 over the source region 5 and the well contact region 6 are removed to form a source contact hole (not shown). The source contact hole is preferably formed by dry etching.

With reference to FIG. 5, the gate oxide film 7 and the interlayer film 9 are made opened so that the source region 5 and the well contact region 6 are exposed. Then, a metal film 13 is formed by, for example, sputtering or vapor deposition to be in contact with the source region 5 and the well contact region 6 that are exposed. The metal film 13 may be made of a material capable of forming a silicide layer having a low resistivity by reaction with silicon carbide, such as nickel, titanium, aluminum, molybdenum, tungsten, a composite membrane including the materials above, or a silicide film. The metal film 13 may have a thickness of, for example, 1 nm to 500 nm.

The deposition of the metal film 13 is followed by a first heat treatment performed at a predetermined temperature in an inert gas, such as nitrogen or argon, or in a vacuum. This causes a silicidation reaction between the metal of the metal film 13 and silicon carbide included mainly in the source region 5, thereby forming the silicide layer 10. Such silicidation reaction is, meanwhile, prevented from occurring between the metal of the metal film 13 and the silicon oxide film such as the interlayer film 9. The silicidation reaction described above can be induced by the first heat treatment performed at temperatures between, for example, 600° C. and 1000° C. inclusive where the metal of the metal film 13 reacts with silicon carbide but does not react with the silicon oxide film, Consequently, the silicide layer 10 having a low resistance is formed in the greater part of the source region 5, thereby reducing the source resistance of the semiconductor device 100 and thus reducing the ON resistance of the semiconductor device 100.

Then, in the present embodiment, the formation of the silicide layer 10 is followed by the removal of the unreacted metal film 13. Then, a second heat treatment is performed at temperatures higher than those of the first heat treatment in which the silicide layer 10 has been formed. This can further reduce the resistance of the silicide layer 10.

After the formation of the silicide layer 10, a metal film (not shown) made of aluminum (Al) is formed on the silicide layer 10 and the interlayer film 9 by, for example, sputtering or vapor deposition. Then, the formed metal film is patterned to form the source electrode 11 and gate wiring (not shown) electrically connected with the gate electrode 8 in the region outside the active region (not shown). Similarly, the drain electrode 12 is formed on the back surface of the semiconductor substrate 1.

The semiconductor device 100 shown in FIG. 1 can be manufactured through the process described above.

Subsequently, the following describes a method for adjusting the temperature characteristics of channel resistance via p-type impurity concentrations in the front surfaces of the well regions 3 and 4.

The withstand voltage of the semiconductor device 100 depends on the thickness of the drift layer 2. The thickness of the drift layer 2 of the silicon carbide semiconductor device can be made smaller than that of the drift layer 2 of the silicon semiconductor device. This reduces the resistance component of the drift layer 2 and increases the resistance component of the channel included in the ON resistance of the semiconductor device 100.

In general, the carrier mobility that determines the channel resistance is greatly restricted by the Coulomb scattering and the phonon scattering caused by the ionized dopant, the roughness scattering owing to irregularities of the interface, the phonon scattering at the interface, and the Coulomb scattering owing to the interface state.

In recent years, the interface state density has been reduced owing to the improvement in the technique for inactivating the interface state, and thus, the restriction attributable to the phonon scattering is increased in a MOSFET having an extremely small interface state density. The phonon scattering intensifies with increasing temperature, and thus, the carrier mobility in the channel has the negative temperature characteristic. If this is the case, in the range of room temperature to about 150° C., the channel resistance of the power MOSFET has the positive temperature characteristic and other resistances including the drift resistance also have the positive temperature characteristic. Consequently, the ON resistance of the power MOSFET has the positive temperature characteristic.

Meanwhile, in a case where the p-type impurity concentration in the front surface of the well region increases up to a point, the carrier mobility in the channel is subjected to a great restriction attributable to the Coulomb scattering caused by ionized impurities. The Coulomb scattering weakens as the temperature increases, and thus, the carrier mobility in the channel increases with increasing temperature. In this case, the channel resistance has the negative temperature characteristic and the ON resistance of the power MOSFET can also have the negative temperature characteristic.

In a case where the interface state density at the interface between the well region and the gate oxide film increases up to a point, the carrier mobility in the channel is subjected to a great restriction attributable to the Coulomb scattering owing to the interface state. In this case as well, the Coulomb scattering weakens as the ambient temperature increases. Thus, as the temperature increases, the Coulomb scattering weakens and the carrier mobility in the channel increases. Consequently, the channel resistance has the negative temperature characteristic and the ON resistance of the power MOSFET can also have the negative temperature characteristic.

The Coulomb scattering weakens as the temperature increases but the phonon scattering intensifies as the temperature increases. Thus, the temperature dependence of each kind of scattering is different from that of the other, so that the temperature characteristic of the carrier mobility in the channel shifts from positive to negative or from negative to positive at a certain temperature and the temperature characteristic of the channel resistance also shifts from positive to negative or from negative to positive. Therefore, the p-type impurity concentration in the well region and the interface state density are changed, which can adjust the temperature at which the temperature characteristic of the ON resistance of the semiconductor device as a whole shifts from positive to negative or from negative to positive.

Assuming that the interface state density is constant, the p-type impurity concentration in the front surface of the well region is increased to some extent, so that the channel resistance has the negative temperature characteristic within the specific temperature range of room temperature to about 150° C. If the drop in channel resistance decreasing with increasing temperature within the specific temperature range is proportionate to the amount of increase in other resistance components including the resistance in the drift layer, the ON resistance of the semiconductor device as a whole is kept substantially constant in the temperature range. Unfortunately, if the impurity concentration is increased such that the channel resistance monotonously decreases in the wide temperature range of room temperature to about 150° C. where the semiconductor device is normally used, the channel resistance on the low-temperature side significantly increases.

Thus, in the present embodiment, the semiconductor device 100 includes the first unit cell 50 having the first well region 3 and the second unit cell 60 having the second well region 4, where the two well regions are different from each other.

More specifically, the first unit cell 50 and the second unit cell 60 are formed as described below. As to the well regions 3 and 4, a nitriding treatment is performed on the gate oxide film 7 to reduce the interface state density at the interface between the gate oxide film 7 and the well regions 3 and 4, and thus, the interface state density has, in the band gap, a mean value of $1 \times 10^{12}$ $eV^{-1}$ $cm^{-2}$ or less. While the interface state density has, in the band gap, a mean value of $1 \times 10^{12}$ $eV^{-1}$ $cm^{-2}$ or less as a result of the nitriding treatment, if the effective acceptor density included the depletion region resulting from inversion in the well regions is more than $3.5 \times 10^{12}$ $cm^{-2}$, the carrier mobility in the channel has the positive temperature characteristic. If the effective acceptor density is less than $3.5 \times 10^{12}$ $cm^{-2}$, the carrier mobility in the channel has the negative temperature characteristic.

Thus, the p-type impurity concentration in the front surface of the first well region 3 is set to be higher than the p-type impurity concentration in the front surface of the second well region 4. For example, the impurity concentrations are adjusted such that the effective acceptor density included in the depletion region resulting from inversion induced by the application of a gate bias of 15 V stands at $7.8 \times 10^{12}$ $cm^{-2}$ in the first unit cell 50 and stands at $3.0 \times 10^{12}$ $cm^{-2}$ in the second unit cell 60. In particular, if each of the well regions 3 and 4 has the impurity concentration being constant in the depth direction, the effective acceptor concentration is desirably more than or equal to $1.0 \times 10^{17}$ $cm^{-3}$ such that the effective acceptor density included in the depletion region resulting from inversion becomes greater than $3.5 \times 10^{12}$ $cm^{-2}$.

More preferably, it is particularly desired that the p-type impurity concentration in the front surface of the first well region 3 is set such that the effective acceptor concentration across the depth of the depletion region which results from inversion and extends from the front surface in the operation of the MOSFET becomes greater than or equal to $1.0\times10^{17}$ cm$^3$ and becomes twice the effective acceptor concentration or more in the front surface of the second well region 4.

Meanwhile, it is acceptable that the effective acceptor concentration in the front surface of the first well region 3 is less than or equal to $1.0\times10^{17}$ cm$^{-3}$ in a case where the interface state is insufficiently activated and thus the interface state density in the front surface of the first well region 3 is more than or equal to $1\times10^{12}$ eV$^{-1}$ cm$^{-2}$.

Figure 6:
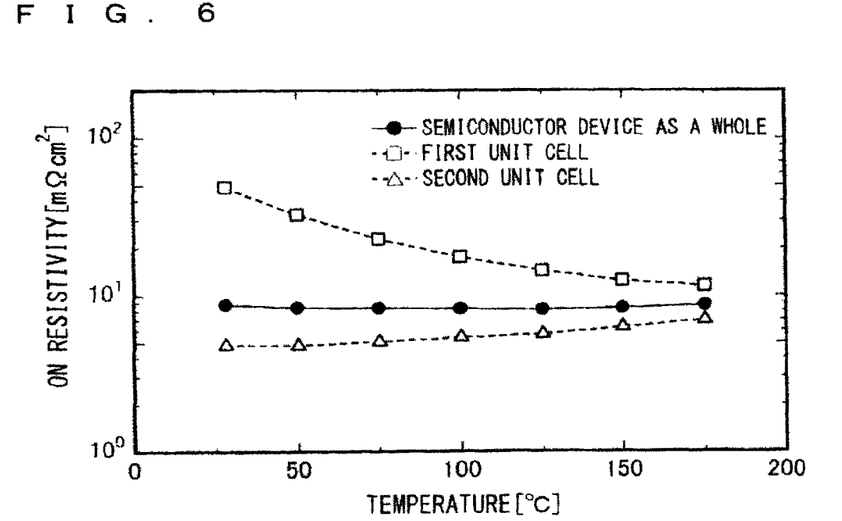
FIG. 6 A view illustrating temperature characteristics of the ON resistance of the semiconductor device according to the embodiment 1 of the present invention.
Figure 7:
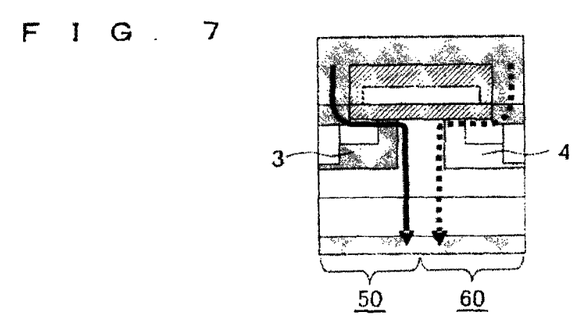
FIG. 7 A cross-sectional view of current paths of the semiconductor device according to the embodiment 1 of the present invention.

FIG. 6 shows the temperature characteristics of the ON resistance of the semiconductor device 100 according to the present embodiment. With reference to FIG. 6, the vertical axis indicates the ON resistivity, the horizontal axis indicates the temperature, the graph shown by □ indicates the ON resistivity of the first unit cell 50, the graph shown by Δ indicates the ON resistivity of the second unit cell 60, and the graph shown by ● indicates the ON resistivity of the semiconductor device 100 as a whole. FIG. 7 is a partial cross-sectional view of current paths of the semiconductor device 100 according to the present embodiment. The ON resistivity of the first unit cell 50 is the resistivity in the current path formed between the source electrode 11 and the drain electrode 12 with the channel of the first well region 3 located therebetween and the ON resistivity of the second unit cell 60 is the resistivity in the current path formed between the source electrode 11 and the drain electrode 12 with the channel of the second well region 4 located therebetween.

With reference to FIG. 6, the p-type impurity concentration is increased to some extent in the first well region 3 of the first unit cell 50, providing the negative temperature characteristic and causing an increase in the channel resistance in the first well region 3. Consequently, in the first unit cell 5, the amount of decrease in the channel resistance along with increased temperature exceeds the amount of increase in other resistances having the positive temperature characteristic along with increased temperature, so that the ON resistance of the first unit cell 50 as a whole has the negative temperature characteristic as shown in FIG. 6. With reference to FIG. 6, the impurity concentration of the second well region 4 is set to be relatively low in the second unit cell 60, and thus, the channel resistance in the second well region 4 has the positive temperature characteristic in the temperature region from room temperature to about 150° C. The resistance components other than the channel resistance have the positive temperature characteristic, and thus, the ON resistance of the second unit cell 60 has the positive temperature characteristic as shown in FIG. 6.

The first unit cell 50 having the negative temperature characteristic and the second unit cell 60 having the positive temperature characteristic are individually prepared in advance and the temperature characteristic of each unit cell such as the one shown in FIG. 6 is measured. Then, the constituent ratio between the first unit cells 50 and the second unit cells 60 is set on the basis of the measured temperature characteristics such that the resistance value of the semiconductor device 100 as a whole has the constant temperature characteristic. In the present embodiment, the semiconductor device 100 is manufactured to include, in a constituent ratio of 1:4, the first unit cells 50 and the second unit cells 60 having the temperature characteristics shown in FIG. 6. Consequently, as shown in FIG. 7, the semiconductor device 100 as a whole includes two kinds of current paths formed therein, each of which passing through the corresponding one of the first unit cell 50 and the second unit cell 60. This eliminates or reduces variations, with temperature changes, in the ON resistivity of the semiconductor device 100 as a whole.

In the configuration described above, the first unit cell 50 in which the channel resistance has the negative temperature characteristic and the second unit cell 60 in which the channel resistance has the positive temperature characteristic are formed and the constituent ratio therebetween is set such that the resistance value of the semiconductor device 100 as a whole has the constant temperature characteristic. This eliminates or reduces variations, with temperature changes, in the ON resistance of the semiconductor device 100 as a whole in the temperature range of room temperature to about 150° C. If the semiconductor device without the present invention applied thereto includes, for example, only the second unit cells 60, the ON resistance at around 200° C. becomes about 1.5 times as high as the ON resistance at room temperature. In the present embodiment, it has been confirmed that, as shown in FIG. 6, the changes in the semiconductor device 100 as a whole in the temperature range of room temperature to around 200° C. is reduced to 4% or less and the ON resistance is substantially constant.

The first unit cell 50, in which the first well region 3 has a relatively high p-type impurity concentration and the channel resistance accordingly has the negative temperature characteristic, has the increased ON resistance in a low-temperature region at around room temperature because of the increased p-type impurity concentration. In the semiconductor device 100 including the first unit cell 50 and the second unit cell 60, a greater amount of current flows toward the second unit cell 60 having a lower resistance in the low-temperature region at around room temperature. This eliminates or reduces an increase in the ON resistance of the semiconductor device 100 as a whole in the low-temperature region at around room temperature.

The first unit cell 50 and the second unit cell 60 have different ON resistivities, leading to different heat values for different unit cells. The concentration of identical unit cells in some regions may cause uneven heat distribution in the semiconductor device as a whole, resulting in a local increase in the amount of heat. In the present embodiment, meanwhile, as shown in FIG. 3, the first unit cells 50 and the second unit cells 60 are alternately arranged in accordance with the constituent ratio therebetween. This evenly diffuses the amount of heat generated in the first unit cell 50 and the amount of heat generated in the second unit cell 60 across the semiconductor device 100, thereby eliminating or reducing the local increase in the amount of heat.

In the present embodiment, the two kinds of well regions being the first well region 3 and the second well region 4 are used to keep the ON resistance constant. Moreover, a third well region and a fourth well region whose channel resistances have different temperature characteristics may be added to more precisely adjust the temperature characteristic of the ON resistivity of the semiconductor device as a whole. This can further reduce ON resistivity variations with temperature changes.

Embodiment 2

As described above, in the embodiment 1, the impurity concentration in the well region is adjusted to change the temperature characteristic of each unit cell. The present invention should not be limited to the above. As an embodiment 2, the following describes the semiconductor device in which the interface state density at the interface between the well region and the gate oxide film is adjusted to change the temperature characteristic of each unit cell.

The following describes an aspect different from the embodiment 1 of the present invention, in other words, the adjustment of the interface state density aimed to change the temperature characteristic of each unit cell, and the description of the same or corresponding aspect is omitted.

In the embodiment 1, the first and the second well regions 3 and 4 have different p-type impurity concentrations, so that the channel resistance has different temperature characteristics being positive and negative in different unit cells. Alternatively, in the semiconductor device according to the embodiment 2, the interface between the first well region 3 and the gate oxide film 7 and the interface between the second well region 4 and the gate oxide film 7 have different interface state densities, so that the channel resistance has different temperature characteristics being positive and negative in different unit cells.

Figure 8:
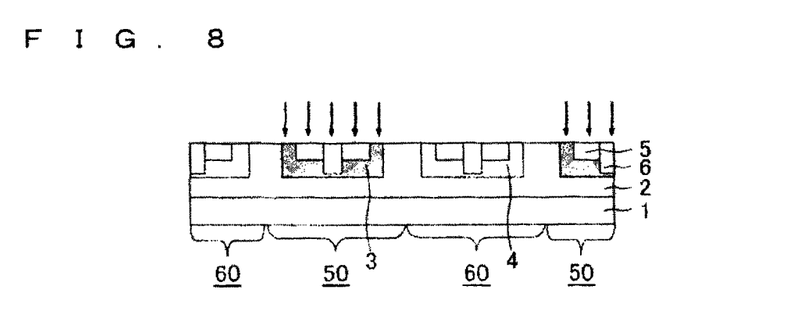
FIG. 8 A cross-sectional view of a process of the method for manufacturing the semiconductor device according to an embodiment 2 of the present invention.

In particular, as shown in FIG. 8, electron beams are injected into only the front surface of the first well region 3 immediately before the process of forming the gate oxide film 7 in the method for manufacturing semiconductor device. This increases the interface state density at the interface between the first well region 3 of the first unit cell 50 and the gate oxide film 7. Meanwhile, electron beams are not injected into the front surface of the second well region 4 and thus the interface state density in the second unit cell 60 is reduced due to the nitriding treatment performed on the gate oxide film 7, resulting in the interface state density smaller than that of the first well region 3 into which the electron beams have been injected. The mean value of the interface state density can be calculated on the basis of the flat band voltage or the threshold voltage of the semiconductor device. In the present embodiment, the first unit cell 50 has an interface state density of $2.6 \times 10^{12}$ $eV^{-1}$ $cm^{-2}$ and the second unit cell 60 has an interface state density of $8.3 \times 10^{11}$ $eV^{-1}$ $cm^{-2}$.

The interface state density may be increased by methods other than the injection of electron beams described above. The same effects can be produced by implantation of ions of any chemical element that are not electrically activated in semiconducting crystals after implantation. The electron beam injection or the ion implantation in the process above may be performed after the high-temperature heat treatment aimed to electrically activate the dopant implanted into the first and second well regions 3 and 4, the source region 5, the well contact region 6, and the termination region, so that the interface state density can be increased more efficiently.

In the present embodiment, the impurity concentration in the second well region 4 is set to be higher than the p-type impurity concentration in the first well region 3. For example, the impurity concentrations in the first well region 3 and the second well region 4 are adjusted such that the effective acceptor density included in the depletion region resulting from inversion in the application of a gate bias of 15 V stands at $1.5 \times 10^{12}$ $cm^{-2}$ in the first well region 3 and stands at $3.0 \times 10^{12}$ $cm^{-2}$ in the second well region 4.

In the semiconductor device according to the present embodiment having undergone the above-described process, the channel resistance of the first unit cell 50 including the first well region 3 to which the electron beams have been injected has the negative temperature characteristic as a result of an increase in interface state density and thus the ON resistance of the first unit cell 50 as a whole also has the negative temperature characteristic. Meanwhile, in the second unit cell 60 including the second well region 4 with no electron beams injected thereinto, the interface state density does not increase, so that the channel resistance has the positive temperature characteristic and thus the ON resistance of the second unit cell 60 as a whole also has the positive temperature characteristic.

Figure 9:
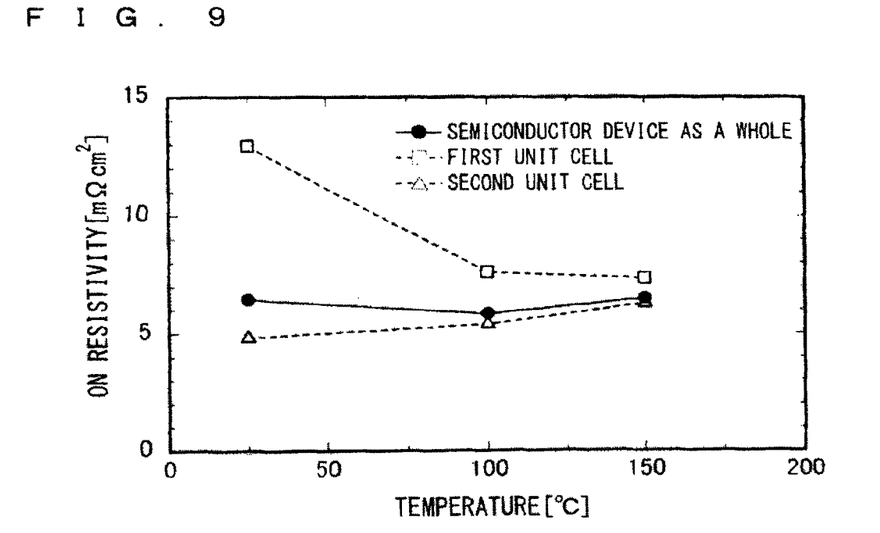
FIG. 9 A view illustrating temperature characteristics of the ON resistance of the semiconductor device according to the embodiment 2 of the present invention.

FIG. 9 shows the temperature characteristics of the ON resistance of the semiconductor device according to the present embodiment. With reference to FIG. 9, the vertical axis indicates the ON resistivity, the horizontal axis indicates the temperature, the graph shown by □ indicates the ON resistivity of the first unit cell 50, the graph shown by Δ indicates the ON resistivity of the second unit cell 60, and the graph shown by ● indicates the ON resistivity of the semiconductor device as a whole.

With reference to FIG. 9, the ON resistance of the first unit cell 50 has the negative temperature characteristic as a result of an increase in interface state density and the ON resistance of the second unit cell 60 has the positive temperature characteristic. The constituent ratio between the first unit cells 50 and the second unit cells 60 are set on the basis of the temperature characteristics of the ON resistance of the first unit cell 50 and the ON resistance of the second unit cell 60. In the embodiment 2, the semiconductor device is manufactured to include, in a constituent ratio of 1:4, the first unit cells 50 and the second unit cells 60. This eliminates or reduces, as shown in FIG. 9, fluctuations of the ON resistance of the semiconductor device as a whole in the temperature region from room temperature to 150° C.

The first unit cell 50, in which the interface state density is relatively high and the channel resistance accordingly has the negative temperature characteristic, has the increased ON resistance in a low-temperature region at around room temperature because of the increased interface state density. In the semiconductor device according to the present embodiment including the first unit cell 50 and the second unit cell 60, a greater amount of current flows toward the second unit cell 60 having a lower resistance in the low-temperature region at around room temperature. This eliminates or reduces an increase in the ON resistance of the semiconductor device 100 as a whole in the low-temperature region at around room temperature.

In the present embodiment, the first unit cell 50 and the second unit cell 60 have different values of p-type impurity concentration and different values of interface state density, leading to different temperature characteristics being positive and negative. Alternatively, only the interface state density may be used as an indicator, leading to different temperature characteristics being positive and negative. In this case, the temperature characteristic of the channel resistance shifts from positive to negative or from negative to positive at an interface state density of $1 \times 10^{12}$ $eV^{-1}$ $cm^{-2}$. Thus, as long as the interface state density is greater than or equal to $1 \times 10^{12}$ $eV^{-1}$ $cm^{-2}$, the channel resistance has the negative temperature characteristic even when the front surface of the well region has a lower effective acceptor density or a lower effective acceptor concentration.

Figure 10:
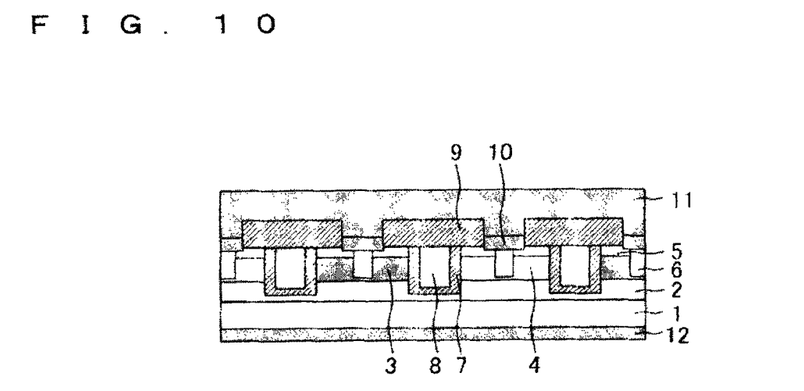
FIG. 10 A cross-sectional view of a configuration of the semiconductor device according to the present invention being a trench-gate MOSFET.

Although the description of the embodiments 1 and 2 has been given assuming that the semiconductor device is the planar gate MOSFET, the present invention is not limited to the planar-gate MOSFET. Alternatively, the semiconductor device may be a trench-gate MOSFET. FIG. 10 is a cross-sectional view of a configuration of the semiconductor device according to the present invention being the trench-gate MOSFET. The trench-gate MOSFET, in which the channel density per unit area can be easily increased and the JFET resistance is eliminated, is effective in reducing the ON resistance.

Figure 11:
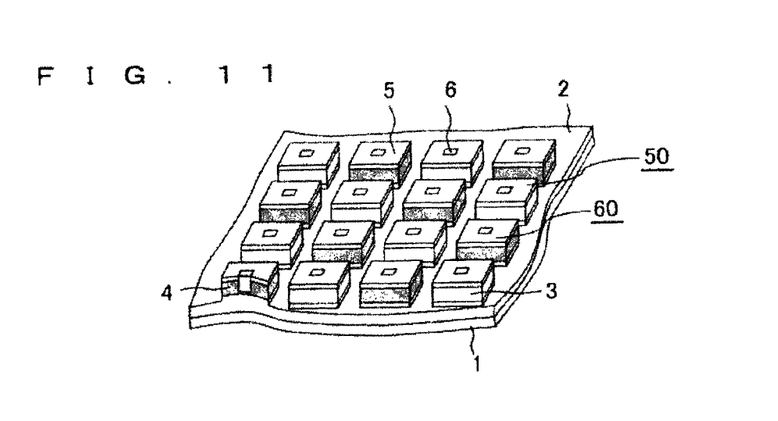
FIG. 11 A bird's-eye view of a configuration of the semiconductor device according to the present invention being a trench-gate MOSFET.

FIG. 11 is a bird's-eye view of the trench-gate MOSFET prior to the formation of the gate oxide film 7. The present invention is applicable to the trench-gate MOSFET, in which the first well region 3 and the second well region 4 are formed in each unit cell to adjust the impurity concentrations.

The present invention can be applied to insulated gate transistor elements such as MOSFETs and IGBTs including a gate insulating film. The insulated gate transistors to which the present invention can be applied include a lateral semiconductor element having the source electrode, the gate electrode, and the drain electrode formed on the same main surface thereof and a vertical semiconductor element having the source electrode and the gate electrode formed thereon opposite to the drain electrode with the substrate located therebetween.

In bipolar transistor elements such as IGBTs, the ON resistance can have the negative temperature characteristic. If this is the case, the ON resistance of the element decreases with increasing element temperature. When the element is used while current is supplied by the constant voltage source, the ON resistance decreases with increasing element temperature, resulting in the increased amount of current flow. This produces the positive feedback; the increased amount of current generates heat and the generated heat causes further generation of heat. Consequently, a concentration of current paths in any chip or between chips would interfere with the temperature control, eventually resulting in thermorunaway.

In such a bipolar transistor element, adjusting the impurity concentration in the well region or the interface state density can change the temperature characteristic of channel resistance. The element with the present invention applied thereto includes a unit cell having the positive temperature characteristic and a unit cell having the negative temperature characteristic, thus eliminating or reducing variations, with temperature changes, in the ON resistance of the semiconductor device as a whole. Thus, when the element is used while current is supplied by the constant voltage source, ON-resistance variations with temperature changes are eliminated or reduced, which eliminates or reduces an increase in the amount of current. This is less likely to produce the positive feedback, eliminating or reducing the possibility of thermal runaway.

The embodiments of the present invention can be arbitrarily combined, or each embodiment can be appropriately varied or omitted within the scope of the invention.

Embodiment 3

In the embodiments 1 and 2, a plurality of kinds of well regions are formed such that the channel resistance has different temperature characteristics in different unit cells. In the present embodiment, the well region is designed such that, out of the channels on a plurality of sides of each individual unit cell having a polygonal shape, the channels on some sides have the channel resistance value in the positive temperature characteristic and the channels on the other sides have the channel resistance in the negative temperature characteristic. This alleviates the temperature dependence of the ON resistance in each individual unit cell.

The following describes the aspect different from the embodiment 1 of the present invention, in other words, the adjustment of the dopant concentrations aimed to change the temperature characteristics of channels on a plurality of sides of each unit cell, and the description of the same or corresponding aspect is omitted.

Figure 12:
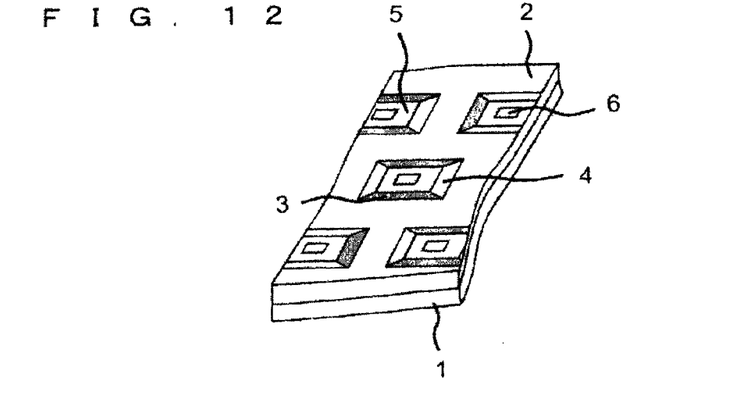
FIG. 12 A bird's-eye view of the semiconductor device according to an embodiment 3 of the present invention.
Figure 13:
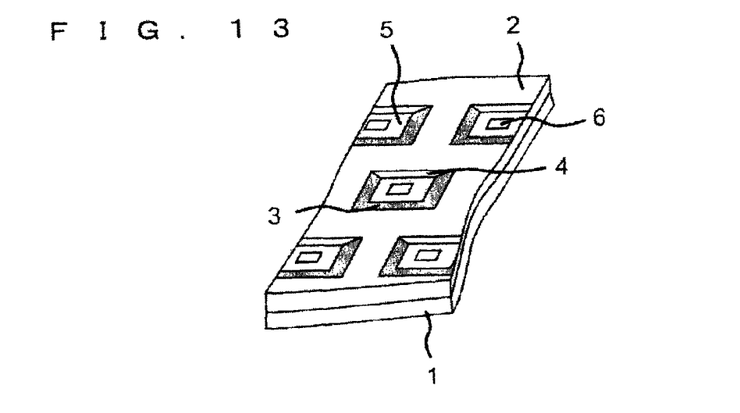
FIG. 13 A bird's-eye view of the semiconductor device according to the embodiment 3 of the present invention.

A configuration of the semiconductor device according to the present embodiment is described. FIGS. 12 and 13 are bird's-eye views of the semiconductor device according to an embodiment 3.

In the embodiment 1, the first unit cell 50 and the second unit cell 60 each include the corresponding one of different well regions being the first well region 3 and the second well region 4, and the first well region 3 and the second well region 4 have different p-type impurity concentrations, so that the channel resistance value has different temperature characteristics being positive and negative in different unit cells. In the present embodiment, both the first well region 3 and the second well region 4 are formed in each individual unit cell, and the first well region 3 and the second well region 4 have different p-type impurity concentrations, so that the channel resistance value has different temperature characteristics being positive and negative in different channels formed on a plurality of sides of each individual unit cell.

For example, with reference to FIG. 12, out of four sides of the unit cell, two sides facing each other include the first well regions 3 formed thereon and the other sides facing each other include the second well regions 4 formed thereon. In another example, as shown in FIG. 13, out of four sides of the unit cell, three sides serve as the first well regions 3 and the remaining side serves as the second well region 4. With reference to FIGS. 12 and 13, the unit cells have a quadrangular cell shape, which is not limited thereto. Alternatively, the unit cells may have a polygonal cell shape other than the quadrangular shape.

The following describes a method for manufacturing the semiconductor device according to the present embodiment. In the present embodiment, after the first well region 3 is formed, p-type impurities are additionally implanted into the region in which the second well region 4 is to be formed. Consequently, the channel resistance value has the positive temperature characteristic in the first well region 3 and the channel resistance value has the negative temperature characteristic in the second well region 4. Thus, the temperature dependence of the resistance value is alleviated within each individual unit cell instead of being alleviated across a plurality of unit cells.

The embodiments of the present invention can be arbitrarily combined, or each embodiment can be appropriately varied or omitted within the scope of the invention.

EXPLANATION OF REFERENCE NUMERALS 1 semiconductor substrate, 2 drift layer, 3 first well region, 4 second well region, 5 source region, 6 well contact region, 7 gate oxide film, 8 gate electrode, 9 interlayer film, 10 silicide layer, 11 source electrode (first electrode), 12 drain electrode (second electrode), 13 metal film, 20 first channel region, 21 second channel region, 50 first unit cell, 60 second unit cell, 100 semiconductor device.

The invention claimed is:
1. A semiconductor device comprising:
a semiconductor substrate;
a drift layer of a first conductivity type formed on a front surface of said semiconductor substrate;
a first well region of a second conductivity type formed on a front surface side of said drift layer;
a second well region of the second conductivity type formed on the front surface side of said drift layer;

first and second source regions of the first conductivity type formed in respective of said first and said second well regions on the front surface side of said drift layer;
a first electrode formed on a front surface of said drift layer, said first electrode being in contact with said first and second source regions;
a second electrode formed on a back surface of said semiconductor substrate; and
a gate structure forming a channel in said first well region and a channel in said second well region,
wherein a channel resistance value of the channel formed in said first well region has a temperature characteristic that the channel resistance value decreases with increasing temperature and a channel resistance value of the channel formed in said second well region has a temperature characteristic that the channel resistance value increases with increasing temperature.

2. The semiconductor device according to claim 1, wherein said first well region and said second well region are formed in a same cell.

3. The semiconductor device according to claim 1, wherein an impurity concentration of the second conductivity type in said first well region is higher than an impurity concentration of the second conductivity type in said second well region.

4. The semiconductor device according to claim 3, wherein
said first conductivity type is n type,
said second conductivity type is p type,
said gate structure includes:
   a gate oxide film formed to be in contact with said drift layer and said first well region or said second well region; and
   a gate metal formed on said gate oxide film,
both an interface state density at an interface between said first well region and said gate oxide film and an interface state density at an interface between said second well region and said gate oxide film are less than or equal to $1 \times 10^{12}$ $eV^{-1}$ $cm^{-2}$,
a depleted region in which a conductivity is inverted in the formation of said channel of said first well region has an effective acceptor density of $3.5 \times 10^{12}$ $eV^{-1}$ $cm^{-2}$ or more, and
a depleted region in which a conductivity is inverted in the formation of said channel of said second well region has an effective acceptor density of less than $3.5 \times 10^{12}$ $eV^{-1}$ $cm^{-2}$.

5. The semiconductor device according to claim 3, wherein
said first conductivity type is n type,
said second conductivity type is p type,
said gate structure includes:
   a gate oxide film formed to be in contact with said drift layer and said first well region or said second well region; and
   a gate metal formed on said gate oxide film,
both an interface state density at an interface between said first well region and said gate oxide film and an interface state density at an interface between said second well region and said gate oxide film are less than or equal to $1 \times 10^{12}$ $eV^{-1}$ $cm^{-2}$,
a depleted region in which a conductivity is inverted in the formation of said channel of said first well region has an effective acceptor concentration of $1.0 \times 10^{17}$ $eV^{-1}$ $cm^{-3}$ or more, and
a depleted region in which a conductivity is inverted in the formation of said channel of said second well region has an effective acceptor concentration of less than $1.0 \times 10^{17}$ $cm^{-3}$.

6. The semiconductor device according to claim 1, wherein
said gate structure includes:
   a gate oxide film formed to be in contact with said drift layer and said first well region or said second well region; and
   a gate metal formed on said gate oxide film, and
an interface state density at an interface between said gate oxide film and said first well region is greater than an interface state density at an interface between said gate oxide film and said second well region.

7. The semiconductor device according to claim 6, wherein
the interface state density at the interface between said first well region and said gate oxide film is more than or equal to $1 \times 10^{12}$ $eV^{-1}$ $cm^{-2}$, and
the interface state density at the interface between said second well region and said gate oxide film is less than $1 \times 10^{12}$ $eV^{-1}$ $cm^{-2}$.

8. The semiconductor device according to claim 1, comprising a plurality of said first well regions and a plurality of said second well regions,
wherein said plurality of first well regions and said plurality of second well regions are arranged alternately in accordance with a constituent ratio between said plurality of first well regions and said plurality of second well regions.

9. The semiconductor device according to claim 8, wherein the constituent ratio between said plurality of first well regions and said plurality of second well regions is adjusted such that a resistance value between said first electrode and said second electrode is constant while a current flows between said first electrode and said second electrode.

10. The semiconductor device according to claim 1, wherein said semiconductor substrate is a silicon carbide substrate.

11. The semiconductor device according to claim 1, wherein said semiconductor substrate has the first conductivity type.

12. The semiconductor device according to claim 1, comprising a third well region of the second conductivity type formed in the front surface of said drift layer, wherein
said gate structure forms a channel in said third well region, and
a channel resistance value of the channel formed in said third well region has a temperature characteristic that the channel resistance value increases with increasing temperature or a temperature characteristic that the channel resistance value decreases with increasing temperature.

13. A semiconductor device comprising:
a semiconductor substrate;
a drift layer of a first conductivity type formed on a front surface of said semiconductor substrate;
a first well region of a second conductivity type formed on a front surface side of said drift layer;
a second well region of the second conductivity type formed on the front surface side of said drift layer;
first and second source regions of the first conductivity type formed in respective of said first well region and said second well region on the front surface side of said drift layer;

a first electrode formed on a front surface of said drift layer, said first electrode being in contact with said first and second source regions;

a second electrode formed on a back surface of said semiconductor substrate; and a gate structure forming a channel in said first well region and a channel in said second well region, wherein a resistance value of a current path formed between said first electrode and said second electrode with the channel of said first well region located therebetween has a temperature characteristic that the resistance value decreases with increasing temperature, and a resistance value of a current path formed between said first electrode and said second electrode with the channel of said second well region located therebetween has a temperature characteristic that the resistance value increases with increasing temperature.

14. The semiconductor device according to claim 13, wherein said first well region and said second well region are formed in a same cell.

15. The semiconductor device according to claim 13, wherein an impurity concentration of the second conductivity type in said first well region is higher than an impurity concentration of the second conductivity type in said second well region.

16. The semiconductor device according to claim 15, wherein said first conductivity type is n type, said second conductivity type is p type, said gate structure includes:

a gate oxide film formed to be in contact with said drift layer and said first well region or said second well region; and a gate metal formed on said gate oxide film, both an interface state density at an interface between said first well region and said gate oxide film and an interface state density at an interface between said second well region and said gate oxide film are less than or equal to $1 \times 10^{12}$ $eV^{-1}$ $cm^{-2}$, a depleted region in which a conductivity is inverted in the formation of said channel of said first well region has an effective acceptor density of $3.5 \times 10^{12}$ $eV^{-1}$ $cm^{-2}$ or more, and a depleted region in which a conductivity is inverted in the formation of said channel of said second well region has an effective acceptor density of less than $3.5 \times 10^{12}$ $eV^{-1}$ $cm^{-2}$.

17. The semiconductor device according to claim 15, wherein said first conductivity type is n type, said second conductivity type is p type, said gate structure includes:

a gate oxide film formed to be in contact with said drift layer and said first well region or said second well region; and a gate metal formed on said gate oxide film, both an interface state density at an interface between said first well region and said gate oxide film and an interface state density at an interface between said second well region and said gate oxide film are less than or equal to $1 \times 10^{12}$ $eV^{-1}$ $cm^{-2}$, a depleted region in which a conductivity is inverted in the formation of said channel of said first well region has an effective acceptor concentration of $1.0 \times 10^{17}$ $cm^{-3}$ or more, and a depleted region in which a conductivity is inverted in the formation of said channel of said second well region has an effective acceptor concentration of less than $1.0 \times 10^{17}$ $cm^{-3}$.

18. The semiconductor device according to claim 13, wherein said gate structure includes:

a gate oxide film formed to be in contact with said drift layer and said first well region or said second well region; and a gate metal formed on said gate oxide film, and an interface state density at an interface between said gate oxide film and said first well region is greater than an interface state density at an interface between said gate oxide film and said second well region.

19. The semiconductor device according to claim 18, wherein the interface state density at the interface between said first well region and said gate oxide film is more than or equal to $1 \times 10^{12}$ $eV^{-1}$ $cm^{-2}$, and the interface state density at the interface between said second well region and said gate oxide film is less than $1 \times 10^{12}$ $eV^{-1}$ $cm^{-2}$.

20. The semiconductor device according to claim 13, comprising a plurality of said first well regions and a plurality of said second well regions, wherein said plurality of first well regions and said plurality of second well regions are arranged alternately in accordance with a constituent ratio between said plurality of first well regions and said plurality of second well regions.

21. The semiconductor device according to claim 20, wherein the constituent ratio between said plurality of first well regions and said plurality of second well regions is adjusted such that a resistance value between said first electrode and said second electrode is constant while a current flows between said first electrode and said second electrode.

22. The semiconductor device according to claim 13, wherein said semiconductor substrate is a silicon carbide substrate.

23. The semiconductor device according to claim 13, wherein said semiconductor substrate has the first conductivity type.

24. The semiconductor device according to claim 13, comprising a third well region of the second conductivity type formed in the front surface of said drift layer, wherein said gate structure forms a channel in said third well region, and a channel resistance value of the channel formed in said third well region has a temperature characteristic that the channel resistance value increases with increasing temperature or a temperature characteristic that the channel resistance value decreases with increasing temperature.

* * * * *